(12) United States Patent
Fukunaka et al.

(10) Patent No.: US 7,847,211 B2
(45) Date of Patent: Dec. 7, 2010

(54) LIGHT RADIATING CONDITIONS SELECTING METHOD, LIGHT RADIATING CONDITIONS SELECTING DEVICE, AND SOLDERING DEVICE

(75) Inventors: Tomoko Fukunaka, Shiga (JP); Masashi Ishiguro, Hyogo (JP); Kenji Takahashi, Osaka (JP); Shinsuke Kurahashi, Hyogo (JP); Michio Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 922 days.

(21) Appl. No.: 11/512,824

(22) Filed: Aug. 30, 2006

(65) Prior Publication Data

US 2007/0050158 A1 Mar. 1, 2007

(30) Foreign Application Priority Data

Aug. 31, 2005 (JP) ............................... 2005-251167

(51) Int. Cl.
*B23K 1/005* (2006.01)
*B23K 26/20* (2006.01)
*G06F 19/00* (2006.01)

(52) U.S. Cl. .............................. 219/121.6; 219/121.85; 700/166

(58) Field of Classification Search ............ 219/121.85, 219/121.63, 121.64–121.66; 700/166
See application file for complete search history.

(56) References Cited

U.S. PATENT DOCUMENTS

| 4,531,044 | A | * | 7/1985 | Chang ................... 219/121.85 |
| 5,506,385 | A | * | 4/1996 | Murakami et al. ...... 219/121.63 |
| 5,893,987 | A | * | 4/1999 | Yamazaki et al. ....... 219/121.61 |
| 6,998,572 | B2 | * | 2/2006 | Endo et al. ............. 219/121.85 |
| 2005/0078318 | A1 | * | 4/2005 | De Groot .................... 356/497 |

FOREIGN PATENT DOCUMENTS

| JP | 2000-22319 A | | 1/2000 |
| JP | 2002353609 A | * | 12/2002 |
| JP | 2003263467 A | * | 9/2003 |
| WO | WO 9501851 A1 | * | 1/1995 |
| WO | WO 03028932 A1 | * | 4/2003 |

\* cited by examiner

*Primary Examiner*—Stephen J Ralis
(74) *Attorney, Agent, or Firm*—RatnerPrestia

(57) ABSTRACT

A method and device capable of properly selecting light radiating conditions in soldering work where components are soldered onto a board with light radiation applied to a solder joint. The device for selecting the light radiation conditions may contain a) an input device for entering information on; b) a storage for storing at least any one of databases on light radiation power and light radiation time for soldering; c) a calculator for determining light radiating conditions according to the information entered through the input device and the database stored in the storage; and d) an output device for outputting the light radiating conditions determined by the calculator. The input device may further comprise i) a component; ii) a board on which the component is soldered; and iii) solder for soldering the component.

6 Claims, 3 Drawing Sheets

LIGHT RADIATING CONDITIONS SELECTING METHOD, LIGHT RADIATING CONDITIONS SELECTING DEVICE, AND SOLDERING DEVICE

FIELD OF THE INVENTION

The present invention relates to a method and device capable of properly selecting light radiating conditions in soldering work where components are soldered onto a board with light radiation applied to a solder joint, and also relates to a soldering device.

BACKGROUND ART

In soldering work that employs laser radiation, soldering conditions, such as light radiation, are conventionally determined by trial-and-error so as to be suitable for each solder joint.

As a prior art soldering device, a solder-cream applying device is well known. The device makes a determination of where solder should be applied according to pad position data prepared by computer aided design (CAD), thereby decreasing operation steps and accelerating soldering work. Such a solder-cream applying device is introduced, for example, in Japanese Patent Unexamined Publication No. 2000-22319.

In conventional soldering work with laser or the like, however, proper determination of light radiation and other conditions needs trial-and-error methods by solder joint at much expense in time and effort.

The solder applying device that controls the solder applying point according to data prepared by CAD can improve the positioning efficiency; however, it does not provide proper selection of light radiating conditions suitable for each soldering. As for determining the light radiating conditions, the CAD-assisted device above still depends on trial-and-error methods at much expense in time and effort.

SUMMARY OF THE INVENTION

The light radiating conditions selecting method of the present invention contains the following steps.

entering, via an input device, at least any one item of information on a component, a board on which the component is soldered, and solder for soldering the component;

determining light radiating conditions by a calculator, according to the entered information through the input device and at least any one of databases stored in a storage on light radiation power and radiation time for soldering; and outputting the light radiating conditions determined by the calculator.

In the method above, receiving already-known information entered through the input device, the calculator determines, according to the input information and the database (demonstrated database), light radiating conditions suitable for soldering work, thereby accelerating time for selecting optimal light radiating conditions, and accordingly, improving productivity.

The light radiating conditions selecting device of the present invention has components as follows:

an input device for entering at least any one item of information on a component, a board on which the component is soldered, and solder for soldering the component;

a storage for storing at least any one of databases on light radiation power and light radiation time for soldering;

a calculator for determining light radiating conditions according to the information entered through the input device and the database stored in the storage; and an output device for outputting the light radiating conditions determined by the calculator.

With the device structured above, receiving already-known information entered through the input device, the calculator determines, according to the input information and the database (demonstrated database), light radiating conditions suitable for soldering work, thereby accelerating time for selecting optimal light radiating conditions, and accordingly, improving productivity.

The soldering device of the present invention solders a component onto a board according to light radiating conditions obtained by the light radiating conditions selecting device. The soldering device contains a light generating source, an input device for accepting light radiating conditions, and a controller for controlling light radiated from the light generating source. The light radiating conditions selecting device mentioned here is the one having the structure of the present invention. Therefore, the soldering device makes use of the advantage of the aforementioned light radiating conditions selecting device.

DETAILED DESCRIPTION OF THE INVENTION

The exemplary embodiment of the present invention is described hereinafter with reference to the accompanying drawings, FIG. 1 through FIG. 5.

Figure 1:
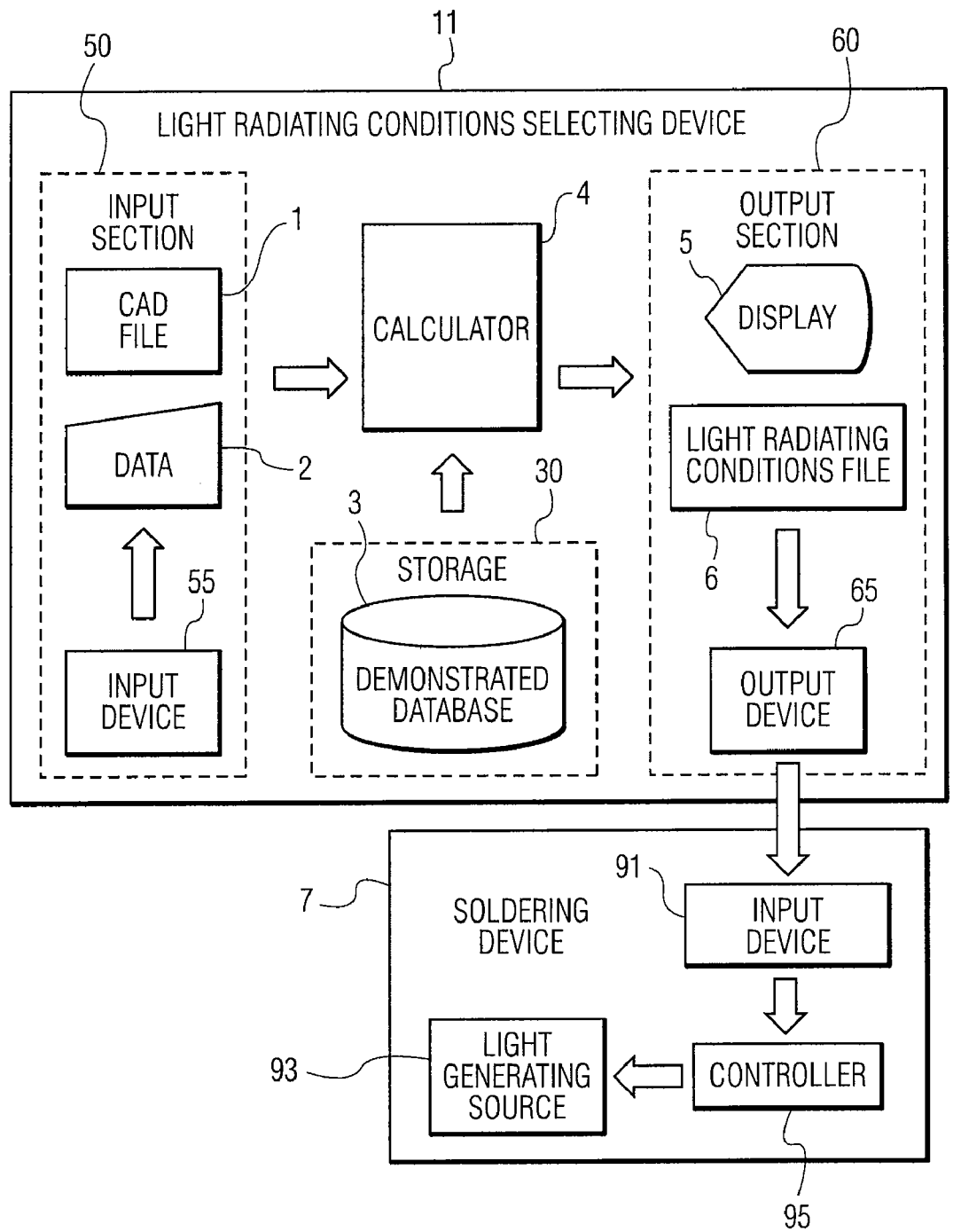
FIG. 1 is a block diagram of the light radiating conditions selecting device and the soldering device of an exemplary embodiment of the present invention.

In FIG. 1, soldering device 7 solders a component onto a board according to light radiating conditions obtained by light radiating conditions selecting device 11.

The light radiating conditions selecting method of the embodiment contains the following steps:

entering, via input device 55, at least any one item of information on a component, a board on which the component is soldered, and solder for soldering the component;

determining light radiating conditions by calculator 4, according to the entered information through input device 55 and at least any one of databases stored in storage 30 on the required amounts of light radiation power and radiation time for soldering; and outputting by output device 65 the light radiating conditions determined by calculator 4.

Light radiating conditions selecting device 11 of the present invention contains input section 50, calculator 4, storage 30, and output section 60. In device 11, input section 50 has input device 55, and output section 60 has output device 65.

Input device 55 accepts at least any one item of information on a component to be soldered, a board on which the component is soldered, and solder for soldering the component.

Storage 30 stores at least any one of databases (i.e., demonstrated databases) on light radiation power and light radiation time for soldering.

Calculator 4 determines light radiating conditions according to the entered information through input device 55 and information stored in storage 30, i.e., a demonstrated database.

Output device 65 outputs the light radiating conditions obtained by calculator 4.

Soldering device 7 solders a component onto a board according to the light radiating conditions obtained by light radiating conditions selecting device 11.

Soldering device 7 contains light generating source 93, light radiating conditions input device 91, and controller 95. Light radiating conditions, which are obtained by light radiating conditions selecting device 11, are entered in input device 91. Receiving light radiating conditions from input device 91, controller 95 controls the amount of light radiation from light generating source 93.

Here will be given details on the method and device of selecting light radiating conditions of the present invention.

In FIG. 1, input section 50 of light radiating conditions selecting device 11 receives CAD file 1 and data 2 that is not included in CAD file 1. Soldering device 7 solders a component onto a board according to the light radiating conditions obtained by light radiating conditions selecting device 11.

CAD file 1 contains the following data: shapes of boards that undergo soldering work; positions at which components are soldered on a board; drilled holes, pads, and wiring patterns. CAD file 1 is an electronic data file obtained in a CAD-assisted board designing process. CAD file 1 is entered via input device 55. Input device 55 contains a keyboard, a mouse, and the like. Data 2, which is not included in CAD file 1, for example, data on a board, a component to be soldered onto the board, and solder, is entered through input device 55.

Input device 55, as described above, accepts at least any one item of information on a component to be soldered; a board on which the component is soldered; and solder for soldering the component.

Storage 30, which is memory or the like in light radiating conditions selecting device 11, stores demonstrated database 3. Demonstrated database 3 stores data on radiating power and radiating time for soldering work, which is prepared on the basis of demonstrated data as history records of soldering work by soldering device 7.

Calculator 4 determines light radiating conditions according to the information entered through input device 55 and at least any one of radiating power and radiating time of light in demonstrated database 3. Calculator 4 is formed of, for example, a central processing unit (CPU).

Display 5, which shows the information fed from calculator 4, is formed of a liquid crystal display. Receiving light radiating conditions file 6 (an electronic data file) from calculator 4, output device 65 of output section 60 outputs the file to soldering device 7.

Here will be described light radiating conditions selecting device 11 having the structure above.

First, input section 50 reads CAD file 1 and sends it to calculator 4. Receiving the data of CAD file 1 from calculator 4, display 5 of output section 60 shows a board and a shape of a component to be soldered in soldering work.

Next, an operator defines a component to be soldered onto the board through input device 55. In the input operation, input device 55 further accepts data 2 that is not included in CAD file 1, for example, thickness of a board; pad surface treatment of a board; a cross sectional area of a lead wire of the component to be soldered; a diameter of wire solder; and composition of solder. Each of data above may be individually typed in, or may be selected from a list shown in display 5.

Further, the operator enters range data for heat capacity calculation through input device 55. The heat capacity is a factor in selecting light radiating conditions used for a solder joint.

After accepting data entries, input device 55 requests calculator 4 to select light radiating conditions. In response to the request, calculator 4 calculates light radiating conditions for a designated component or all components stored in CAD file 1. Output device 65 of output section 60 outputs the calculation result as light radiating conditions file 6.

Figure 2:
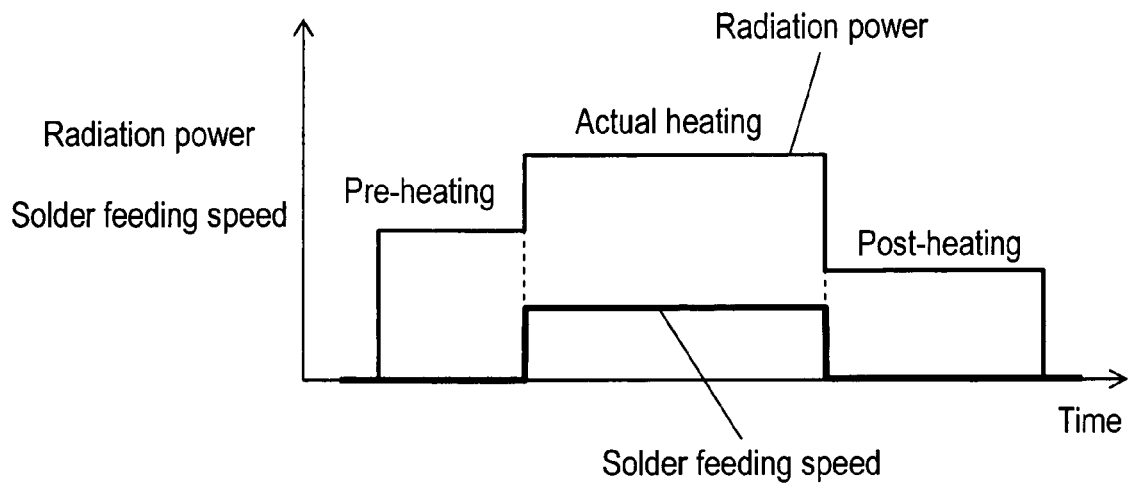
FIG. 2 shows the relationship between light radiation power and solder feeding speed with respect to a lapse of time of the embodiment.

To obtain soldering work in a good condition in soldering device 7, as shown in FIG. 2, radiation power or radiation time of light (for example, laser) should be controlled suitable for each stage of pre-heating, actual heating, and post-heating. The pre-heating is a process of warming a lead and a pad in advance prior to solder feeding. The post-heating is a heating process after solder feeding so that light radiation allows solder to spread properly around a solder joint.

In the heating processes, it is necessary to determine the beam diameter of laser (light), the radiation power of laser (light) and the speed of solder feeding in the actual heating process. FIG. 2 shows light radiating conditions for each process of pre-heating, actual heating, and post-heating. In the graph, the horizontal axis represents a lapse of time, and the vertical axis represents radiation power of laser (light) and the speed of solder feeding. The light radiating conditions of the processes are stored as light radiating conditions file 6 in output section 60 of light radiating conditions selecting device 11. Light radiating conditions file 6, which is determined by calculator 4, is fed from output device 65 of output section 60 with a format readable by soldering device 7.

Now will be described calculation of light radiating conditions for the pre-heating and post-heating processes by calculator 4.

Prior to determining light radiating conditions for the pre-heating and the post-heating processes, calculator 4 calculates heat capacity of a solder joint. (Details thereof will be described later.)

After calculating the heat capacity, calculator 4 searches demonstrated database 3 for data that is closely analogous to the obtained heat capacity to acquire the values of radiation power per unit time for the pre-heating and the post-heating, which are associated with the data.

As the next step, according to data entered through input device 55, i.e., data on the pad surface treatment of a board and solder composition, calculator 4 selects a coefficient corresponding to the data above. Calculator 4 multiplies the coefficient by the calculated value of radiation power above to define an optimal radiation power and radiation time.

Figure 3:
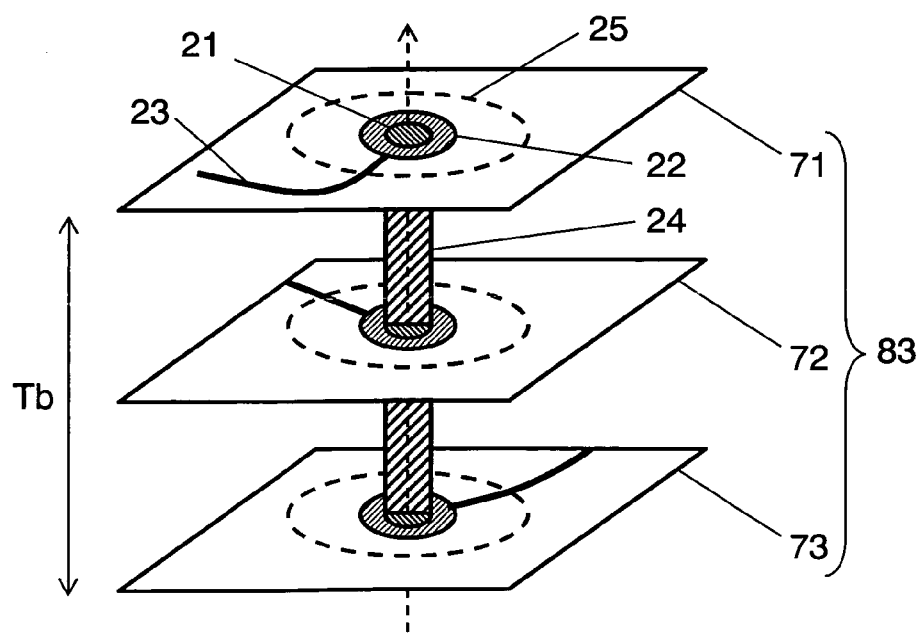
FIG. 3 and FIG. 4 illustrate calculation of heat capacity of a board of the embodiment.
Figure 4:
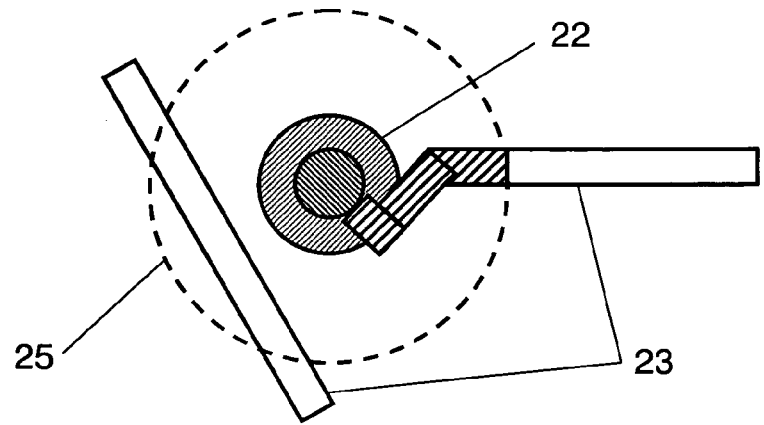

Here will be described how to calculate heat capacity of a board with reference to FIG. 3 and FIG. 4. FIGS. 3 and 4 schematically show a board for illustrating calculation of heat capacity.

In FIGS. 3 and 4, board 83 has a multi-layered structure of top layer 71, inner layer 72, and bottom layer 73. Board 83 has board thickness Tb. Pad 22 is a conductor disposed on each surface of layers 71, 72 and 73. Board 83 contains drilled hole 21, conductive wiring pattern 23, and through-hole 24. Each circle drawn by broken lines shows range 25 (formed of a circle with a radius of r) that includes a solder joint and its periphery.

Now will be given a further explanation on range 25 that includes a solder joint and its periphery.

Because of its thermal conductivity, wiring pattern 23 has an effect on heat capacity of a board. Specifically, in wiring pattern 23, a position having a connection with pad 22 has largely influences on the heat capacity, and the influence decreases with distance from the connecting position. Considering that wiring pattern 23 is connected to a solder joint and necessity that the part around the solder joint having perceptible influence on heat capacity is taken into calculation, range 25 (as a circle with a radius of r) is defined. As for wiring pattern 23, the calculation needs the area that is in range 25 and makes a contact with pad 22, that is, the diagonally shaded areas in FIG. 4. When another component is soldered at a position adjacent to the solder joint above, the radius of range 25 can be changed according to conditions of the solder joint. The radius of range 25 is defined, as described above, through input device 55.

The heat capacity of a board having a solder joint is derived from expression (1) below:

$$\text{Heat capacity of a board} = [\text{drilled hole area}] \cdot a + [\text{lead cross-section area}] \cdot b + [\text{wiring pattern area of bottom layer}] \cdot c + [\text{pad area of bottom layer}] \cdot d + [\text{wiring pattern area of top layer}] \cdot e + [\text{pad area of top layer}] \cdot f + [\text{wiring pattern area of inner layer}] \cdot g + [\text{pad area of inner layer}] \cdot h + [\text{plated area of through-hole}] \cdot i,$$

expression (1)

where, a through i represent a weight corresponding to each value. These weights are obtained from demonstrated data acquired in the past. When the inner layer is formed of two or more sub layers, the calculation is done for each sub layer.

Next will be described how to calculate radiation power per unit time for the actual heating process.

To obtain the radiation power per unit time for the actual heating process, calculator 4 searches demonstrated database 3 for data that is closely analogous to the obtained radiation power for the pre-heating process to acquire the values of radiation power and solder feeding speed for the actual heating, which are associated with the analogous data. After that, according to data entered through input device 55, i.e., a diameter of wire solder and solder composition, calculator 4 selects a coefficient corresponding to the data above. Calculator 4 multiplies the coefficient by the radiation power and solder feeding speed acquired above. The optimal radiation power and solder feeding speed are thus defined.

Solder amount (Sv) is obtained by expression (2) below. After that, heating time (T1) of the actual heating process is obtained by the following calculation: time (T1)=solder amount (Sv)/(solder feeding speed·cross section area of solder). This is shown in expression (3) below.

Figure 5:
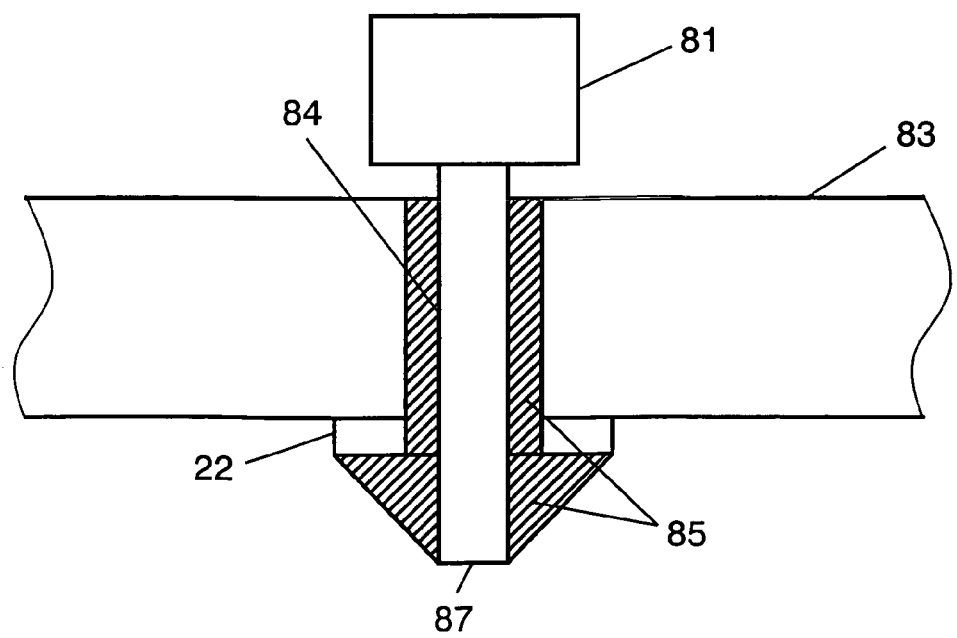
FIG. 5 illustrates calculation of a required amount of solder of the embodiment.

FIG. 5 shows a state of a solder joint in which lead 87 of component 81 passes through through-hole 84 of board 83 and is soldered onto pad 22 formed on the lower side of the board. The diagonally shaded areas in FIG. 5 show solder joint section 85.

Solder amount Sv is an amount used for soldering component 81 onto the diagonally shaded areas of FIG. 5, i.e., solder joint section 85.

$$Sv = \left[ \left\{ \frac{a-b}{2} \times \left( \frac{Sa + Sb + \sqrt{Sa \times Sb}}{3} - Sb \right) \right\} + \left\{ \pi \times \left( \frac{Dr}{2} \right)^2 - Sb \right\} \times Tb \right] \times k,$$

expression (2)

where,
Sv: solder amount
a: diameter of pad (in a circular pad) or side length of pad (in a square pad)
b: diameter of lead (in a circular lead) or side length of lead (in a square lead)
Sa: pad area (including drilled hole area)
$\pi \cdot (a/2)^2$ (in a circular pad) or $a^2$ (in a square pad)
Sb: lead area
$\pi \cdot (b/2)^2$ (in a circular pad) or $b^2$ (in a square pad)
Dr: diameter of drilled hole
Tb: board thickness
k: weight (obtained by demonstrated data in the past)

$$T1 = Sv/(Vs \cdot \pi \cdot (Sr/2)^2)$$

expression (3), where, T1: heating time of actual heating process
Sv: solder amount
Vs: feeding speed of wire solder
Sr: diameter of wire solder According to the embodiment of the present invention, as described above, all the operator has to do is data entry of already-known information, such as CAD file 1 and data 2, through input device 55. Data 2 is not included in CAD file 1 and contains the following data: board thickness; pad surface treatment of a board; lead cross section area of a component to be soldered; and diameter of wire solder. According to the data entered through input device 55 and demonstrated database 3 prepared in advance, the device of the present invention determines light radiating conditions suitable for a solder connecting position, and stores the data as light radiating conditions file 6. This eliminates the need of trial-and-error methods in determining light radiating conditions, thereby enhancing efficiency in soldering work.

By storing the data of light radiating conditions file 6 obtained by light radiating conditions selecting device 11 into a recording medium and loading the data into soldering device 7, or by sending the data directly to soldering device 7 via data communications, soldering work of high quality is provided.

Although the embodiment introduces a structure where light radiating conditions selecting device 11 and soldering device 7 are disposed separate from each other, it is not limited thereto; device 11 can be disposed in device 7, that is, they may be combined in one unit.

Although the structure of the embodiment is used for soldering work, it is also applicable to blazing work.

The device of the present invention, as described above, determines light radiating conditions suitable for each soldering operation, according to already-known information entered through the input device and a demonstrated database. This shortens the time required to obtain proper light radiating conditions, contributing to improved productivity. In particular, when the light radiating conditions have to be changed for each connecting object, such as soldering, the method and device are of great value in selecting proper conditions with high efficiency.

What is claimed is:

1. A light radiating conditions selecting method comprising:
   a) entering, via an input device, at least any one item of information with respect to i) a component; ii) a board on which the component is soldered, the board having pads and wiring patterns including wiring patterns making contact with the pads on a surface thereof; and iii) solder for soldering the component;
   b) calculating heat capacity of the board according to the information of the board, by a calculator;
   c) determining light radiating conditions by the calculator, according to the entered information via the input device, the calculated heat capacity and at least any one of databases stored in a storage with respect to light radiation power and light radiation time for soldering; and
   d) outputting the light radiation conditions determined by the calculator,
   wherein calculating the heat capacity includes the steps of:
   defining a range including the wiring patterns and the board around the pads; and
   calculating the heat capacity disposed within the range with respect to drilled hole area, a lead cross section area, a wiring pattern area, a pad area, and a plated area in a through hole, when calculating the heat capacity with regard to the wiring patterns.

2. The light radiating conditions selecting method of claim 1, wherein the calculator calculates a solder amount according to at least any one item of the information on the board and on the component, and determines the light radiating conditions according to the calculated solder amount and the database stored in the storage.

3. A light radiating conditions selecting device comprising:
   a) an input device for entering at least any one item of information on i) a component; ii) a board on which the component is soldered, the board having pads and wiring patterns including wiring patterns making contact with the pads on a surface thereof; and iii) solder for soldering the component;
   b) a storage for storing at least any one of databases on light radiation power and light radiation time for soldering; and
   c) a calculator for determining light radiating conditions according to the information entered through the input device, heat capacity with respect to a range of the board around the pads, the range including the wiring patterns making contact with the pads and the board disposed within the range and the database stored in the storage; and
   d) an output device for outputting the light radiating conditions determined by the calculator.
   wherein the calculator calculates the heat capacity disposed within the range with respect to a drilled hole area, a lead cross section area, a wiring pattern area, a pad area, and a plated area in a through hole, when calculating the heat capacity with regard to the wiring patterns.

4. The light radiating conditions selecting device of claim 3, wherein the calculator calculates a solder amount according to at least any one item of the information on the board and on the component, and determines the light radiating conditions according to the calculated solder amount and the database stored in the storage.

5. A soldering device that solders a component onto a board according to entered light radiating conditions obtained by a light radiating conditions selecting device, the soldering device comprising:
   a light generating source;
   an input device for accepting the light radiation conditions; and
   a controller for controlling light radiated from the light generating source according to the light radiating conditions received from the input device for accepting the light radiating conditions,
   wherein, the light radiating conditions selecting device contains
   a) a data input device for entering at least any one item of information on i) the component; ii) the board on which the component is soldered, the board having pads and wiring patterns including wiring patterns making contact with the pads on a surface thereof; and iii) solder for soldering the component;
   b) a storage for storing at least any one of databases on light radiation power and light radiation time for soldering; and
   c) a calculator for determining light radiating conditions according to the information entered through the data input device, a heat capacity of a range of the board around the pads and the database stored in the storage, the range including the pads and wiring patterns making contact with the pads and the board disposed within the range; and
   d) an output device for outputting the light radiating conditions determined by the calculator,
   wherein the calculator calculates the heat capacity disposed within the range with respect to a drilled hole area, a lead cross section area, a wiring pattern area, a pad area, and a plated area in a through hole, when calculating the heat capacity with regard to the wiring patterns.

6. The soldering device of claim 5, wherein the calculator calculates a solder amount according to at least any one item of the information on the board and on the component, and determines the light radiating conditions according to the calculated solder amount and the database stored in the storage.

* * * * *

UNITED STATES PATENT AND TRADEMARK OFFICE
CERTIFICATE OF CORRECTION

| | | |
|---|---|---|
| PATENT NO. | : 7,847,211 B2 | |
| APPLICATION NO. | : 11/512824 | |
| DATED | : December 7, 2010 | |
| INVENTOR(S) | : Tomoko Fukunaka et al. | |

It is certified that error appears in the above-identified patent and that said Letters Patent is hereby corrected as shown below:

At Column 7, line 52, "determined by the calculator." should read --determined by the calculator,--

Signed and Sealed this
First Day of March, 2011

David J. Kappos
*Director of the United States Patent and Trademark Office*